US011158661B2

United States Patent
Bonakdar et al.

(10) Patent No.: US 11,158,661 B2
(45) Date of Patent: Oct. 26, 2021

(54) IMAGE SENSOR WITH MICRO-STRUCTURED COLOR FILTER

(71) Applicant: OmniVision Technologies, Inc., Santa Clara, CA (US)

(72) Inventors: Alireza Bonakdar, San Jose, CA (US); Zhiqiang Lin, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 53 days.

(21) Appl. No.: 16/576,603

(22) Filed: Sep. 19, 2019

(65) Prior Publication Data

US 2021/0091130 A1    Mar. 25, 2021

(51) Int. Cl.
*H01L 27/146*    (2006.01)

(52) U.S. Cl.
CPC .. *H01L 27/14621* (2013.01); *H01L 27/14636* (2013.01); *H01L 27/14645* (2013.01)

(58) Field of Classification Search
CPC .......... H01L 25/167; H01L 31/107; H01L 27/14643–14663; H01L 27/14621; H01L 27/14636; H01L 27/14645; H01L 27/14629

See application file for complete search history.

(56) References Cited

U.S. PATENT DOCUMENTS

| | | | |
|---|---|---|---|
| 7,180,112 B2 | 2/2007 | Yokozawa | |
| 8,134,110 B2* | 3/2012 | Yokozawa | H01L 27/14868 250/208.1 |
| 9,431,443 B1 | 8/2016 | Lenchenkov et al. | |
| 2002/0079504 A1 | 6/2002 | Kim | |
| 2010/0128350 A1 | 5/2010 | Findlay et al. | |
| 2012/0235266 A1* | 9/2012 | Ootsuka | H01L 27/14627 257/432 |
| 2017/0207258 A1 | 7/2017 | Lin et al. | |
| 2017/0373109 A1* | 12/2017 | Zheng | H01L 27/14621 |
| 2018/0309949 A1* | 10/2018 | Fossum | H01L 27/14621 |

OTHER PUBLICATIONS

Lee, JK et al. "Efficiency enhancement in a backside illuminated 1.12 μm pixel CMOS image sensor via parabolic color filters"; Opt. Express 2016, 24, 16027-16036.

(Continued)

*Primary Examiner* — Jonathan Han
(74) *Attorney, Agent, or Firm* — Lathrop GPM LLP

(57) ABSTRACT

An image sensor includes a two-dimensional photodiode-array formed in a semiconductor substrate, a first waveguide, and a first color filter. The first waveguide is aligned to a first photodiode of the photodiode-array, located above a top substrate surface of the semiconductor substrate. A first core of the first waveguide has a first core width that is less than a pitch of the photodiode-array in a first direction and a second direction corresponding to respective orthogonal dimensions of the photodiode-array. The first color filter is on a top waveguide surface of the first waveguide and has a first non-uniform thickness above the first core. The first waveguide is between the top substrate surface and the first color filter.

17 Claims, 4 Drawing Sheets

(56) References Cited

OTHER PUBLICATIONS

Kim, HK et al. "Development of Lensed Color Filter technology for higher SNR and lower crosstalk CMOS image sensor" In Proceedings of the International Image Sensor Workshop, Snowbird Resort, UT, USA, Jun. 12-16, 2013, 3 pages.

Shrestha, VR et al. "Polarization-tuned dynamic color filters incorporating a dielectric-loaded aluminum nanowire array." Scientific Reports 5:12450 (Mar. 2015), pp. 1-10.

Wang, A. "Angle Sensitive Pixels for integrated Light Field Sensing," 2012 Dissertation, 197 pages.

Lassiter, JB et al. "Fano Resonances in Plasmonic Nanoclusters: Geometrical and Chemical Tunability" Nano Letters 2010 10 (8), 3184-3189.

Varghese, V. Angle sensitive imaging: A new paradigm for light field imaging; Thesis (2016); pp 1-119.

\* cited by examiner

IMAGE SENSOR WITH MICRO-STRUCTURED COLOR FILTER

BACKGROUND

Camera modules in consumer devices such as stand-alone digital cameras, mobile devices, automotive components, and medical devices include an image sensor and a pixel array thereof. The pixel array includes a plurality of pixels. A pixel array's pixel density is the number of pixels per unit area on the image sensor. In operation, the lens of a camera module forms an image, on the image sensor, of an object in its field of view. The object can be viewed a plurality of infinitesimally small point-sources of illumination—"impulses"—incident on the camera. The lens images each of the plurality of impulses at a plane of the pixel array as a respective one of a plurality of point-spread functions—"impulse responses." The resolution of images captured by the image sensor depends in part on pixel size compared to the size of the impulse response. Accordingly, one way to increase a camera's maximum attainable resolution is to increase pixel density by decreasing pixel size.

SUMMARY OF THE EMBODIMENTS

A cost of decreasing pixel size is that less light reaches each pixel, which results in increased noise in images captured by the image sensor. This cost may outweigh the benefit of increased resolution sought by decreasing pixel size. Conventionally, image sensors include a microlens array aligned to the pixel array, where each microlens collects and directs light to a respective pixel. However, when pixel size is comparable to the wavelength of light being detected, microlenses cease to be effective. Embodiments herein include pixels that lack microlenses and that include non-planar color-filter structures for increasing light capture.

In one aspect, an image sensor includes a two-dimensional photodiode-array formed in a semiconductor substrate, a first waveguide, and a first color filter. The first waveguide is aligned to a first photodiode of the photodiode-array, located above a top substrate surface of the semiconductor substrate. A first core of the first waveguide has a first core width that is less than a pitch of the photodiode-array in a first direction and a second direction corresponding to respective orthogonal dimensions of the photodiode-array. The first color filter is on a top waveguide surface of the first waveguide and has a first non-uniform thickness above the first core. The first waveguide is between the top substrate surface and the first color filter.

DETAILED DESCRIPTION OF THE EMBODIMENTS

Figure 1:
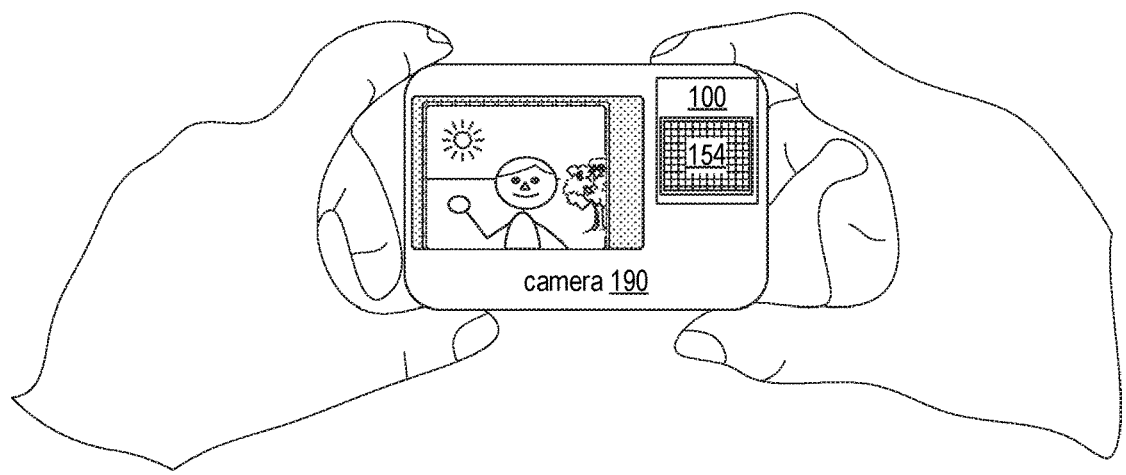
FIG. 1 depicts a camera that includes an image sensor, in an embodiment.

FIG. 1 depicts a camera 190 imaging a scene. Camera 190 includes an image-sensor 100, which includes a pixel array 154. Image sensor 100 may part of a chip-scale package or a chip-on-board package.

Figure 2:
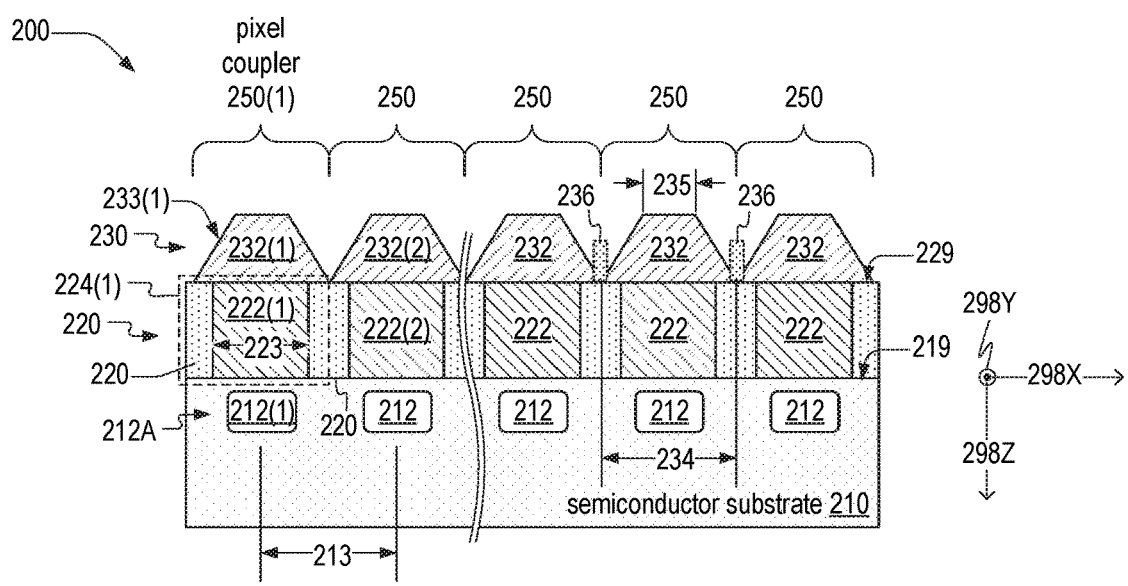
FIG. 2 is cross-sectional schematic view of an image sensor, which is an embodiment of the image sensor of FIG. 1.

FIG. 2 is a cross-sectional schematic of an image sensor 200, which is an example of image sensor 100. The cross-section illustrated in FIG. 2 is parallel to a plane, hereinafter the x-z plane, formed by orthogonal directions 298X and 298Z, which are each orthogonal to direction 298Y. Herein, the x-y plane is formed by orthogonal directions 298X and 298Y, and planes parallel to the x-y plane are referred to as transverse planes. Unless otherwise specified, heights of objects herein refer to the object's extent in direction 298Z, or a direction 180° opposite thereto.

Image sensor 200 includes a semiconductor substrate 210. Semiconductor substrate 210 has a top substrate surface 219, which may be perpendicular to direction 298Z. Semiconductor substrate 210 includes a photodiode array 212A, formed of a plurality of photodiodes 212, one of which is photodiode 212(1). The plurality of photodiodes 212 are arranged in a plurality of rows and columns in directions 298X and 298Y respectively. In embodiments, photodiode array 212A is part of a pixel array formed in semiconductor substrate 210, where each of the plurality of photodiodes is part of a respective one of a plurality of pixels of the pixel array. Photodiode-array 212A has a pixel pitch 213 in direction 298X. In direction 298Y photodiode-array 212A has pitch $P_y$ that, in embodiments equals pixel pitch 213. In embodiments, pixel pitch 213 is less than 1.1 µm, 0.9 µm for example.

Image sensor 200 also includes a first waveguide 224(1) aligned to photodiode 212(1). Waveguide 224(1) is above top substrate surface 219 and includes a waveguide core 222(1) surrounded by a region of a cladding layer 220. Each waveguide core 222 has a width 223 that is less than pixel pitch 213 in direction 298X and less than pitch $P_y$. In embodiments, width 223 of a waveguide 222 depend on the spectral passband of the color filter 232 aligned thereto, for example, to optimize coupling efficiency of wavelengths transmitted by said color filter 232. Cladding layer 222 has a refractive index that is less than a refractive index of waveguide core 222. In embodiments, core width 223 is between seventy percent and ninety percent of pixel pitch 213. This range balances a tradeoff between mode confinement and coupling efficiency.

In many image sensors, the pixel array includes a microlens array aligned thereto such that each of a plurality of microlenses of the microlens array is aligned to a respective pixel of the pixel array. The microlens improves image quality by directing light incident thereon to the photodiode aligned thereto, which increases the magnitude of detected illumination and hence also increases signal-to-noise ratios.

As pixel pitch 213 and pitch $P_y$ decrease to be on the same scale as the wavelength of light incident on image sensor 200, microlenses cease to be effective light collectors. For visible electromagnetic wavelengths, microlenses cease being effective when pixel pitch is approximately one micrometer. This may be understood by the expression of angular resolution $\Delta\theta$ of an imaging system with aperture diameter D: $\Delta\theta = \arcsin(1.22\lambda/D)$. Angular resolution $\Delta\theta$ refers to the smallest angular separation between two objects resolvable by the imaging system. As D decreases and approaches $1.22\lambda$, the $\Delta\theta$ approaches ninety degrees, which is a poor value of angular resolution.

Image sensor 200 also includes a color filter 232(1) on a top surface 229 of waveguide 224(1). In embodiments, at least one of surfaces 219 and 229 is parallel to the x-y plane. In embodiments, top surface 229 is planar.

Waveguide 224(1) is between top substrate surface 219 and color filter 232(1). Color filter 232(1) has a top surface 233(1) that, as a function of position in direction 298X, has non-uniform height above waveguide core 222(1). Accordingly, color filter 232(1) has non-uniform thickness that varies as a function of position in direction 298X.

In embodiments, cladding layer 220 has a spectral passband that is wider than a spectral passband of color filter 232(1). For example, cladding layer 220 formed of a dielectric, and color filter 232 is includes dye and/or pigment that absorbs certain wavelengths of light, thereby permitting transmission of light within a certain range of wavelengths complementary to the absorbed wavelengths. In embodiments, a waveguide core 222 and the color filter 232 aligned thereto are formed of a same material, and may be monolithic. For example, (i) waveguide core 222(1) and color filter 232(1) may be formed of a same material and/or be monolithically formed, and (ii) waveguide core 222(2) and color filter 232(2) may be formed of a same material and/or be monolithically formed, where color filter 232(1) and 232(2) have different spectral passbands and/or are formed of different materials.

Waveguide 224(1), and color filter 232(1) comprise a pixel coupler 250(1). In embodiments, image sensor 200 includes a plurality of pixel couplers 250 each aligned to a respective photodiode 212. Pixel coupler 250(1) is one of the plurality of pixel couplers 250. Each of the plurality of pixel couplers 250 includes a respective waveguide core 222 and color filter 232. In embodiments, each of the plurality of pixel couplers 250 are identical, such that each waveguide core 222 and color filter 232 are geometrically identical. When image sensor 200 includes a plurality of pixel couplers 250, the plurality of color filters 232 comprise a color-filter layer 230. In color-filter layer 230, adjacent color filters 232 may have different spectral passbands such that they form a color-filter array associated with either an additive color space or subtractive color space. Color-filter arrays associated with an additive color space include a Bayer filters and variants there. Color-filter arrays associated with subtractive color space include a CMY filter arrays with cyan, magenta, and yellow filters.

In embodiments, color-filter layer 230 include pillars 236 between and/or separating adjacent color filters 232, or surrounding one or more color filters 232. Pillars 236 may have a height above surface 229 less than or equal to color filters 232, a width less than or equal to 0.2 µm, and may extend into cladding layer 220. In embodiments, one or more pillars 236 include a metal section proximate surface 229 and a transparent (e.g., panchromatic) oxide section thereabove. The metal section reduces cross-talk from illumination incident at high chief-ray angles. The oxide section increases pixel response at the cost of increased cross-talk. In embodiments, target values of pixel response and cross-talk determine the geometry and metal/oxide apportionment of pillars 236.

In embodiments, waveguide cores 222 are arranged as a two-dimensional array such that each waveguide core 222 is aligned to a respective one of the plurality of photodiodes 212 and is surrounded by a respective region of cladding layer 220. In embodiments, cladding layer 220 is a single continuous layer on substrate top surface 219 with a plurality of apertures therethrough. Each aperture is aligned with a respective photodiode 212 and is filled with a respective waveguide core 222.

In FIG. 2, each color filter 232 is illustrated as having a trapezoidal cross-section in the x-z plane. In this plane, the trapezoid has a bottom-base width 234 and a top-base width 235. In embodiments, bottom-base width 234 is equal to pixel pitch 213, or less than pixel pitch 213, for example, when pillars 236 are present. The cross-section may be that of an isosceles trapezoid, as illustrated in FIG. 2, or that of a different type of trapezoid, such as an acute trapezoid, a right trapezoid, or an obtuse trapezoid. In embodiments, the three-dimensional shape one or more color filters 232 is a rectangular frustum, its bottom and top bases having widths 234 and 235 respectively, and being parallel to the x-y plane, as shown in FIG. 3.

Figure 3:
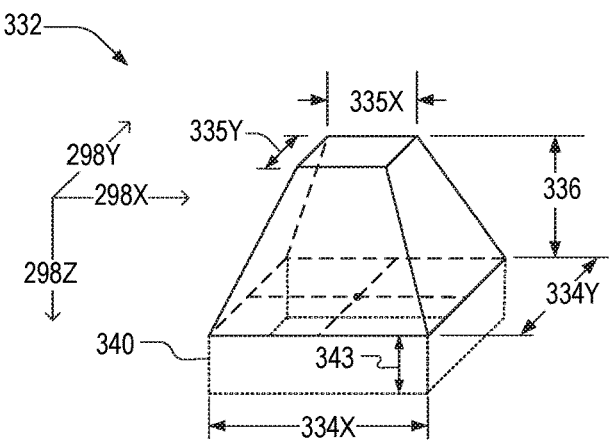
FIG. 3 is a schematic of a rectangular-frustum color filter, which is an embodiment of a color filter of the image sensor of FIG. 2.

FIG. 3 is a schematic of a rectangular-frustum color filter 332, which is an example of color filter 232. Rectangular-frustum color filter 332 has bottom-base widths 334X and 334Y in directions 298X and 298Y, respectively. Each of bottom-base widths 334X and 334Y is an example of bottom-base width 234, FIG. 2. Rectangular-frustum color filter 332 has top-base widths 335X and 335Y in directions 298X and 298Y, respectively. Each of top-base widths 335X and 335Y is an example of top-base width 235, FIG. 2. In the x-y plane, rectangular-frustum color filter 332 has a square cross-section when widths 334X and 334Y are equal, and a rectangular cross-section when widths 334X and 334Y are unequal. Rectangular-frustum color filter 332 has a height 336 between its bottom base and its top base.

In embodiments, height 336 exceeds the wavelength of incident illumination inside color filter 332. A smaller height may not provide sufficient color filtering or refraction. In embodiments, when $\lambda_0$ is the longest free-space wavelength of illumination incident color filter 332, which has refractive index $n(\lambda_0)$ at $\lambda_0$, height 336 exceeds $\lambda_0/n(\lambda_0)$.

In embodiments, color-filter layer 230 includes a two-dimensional array of rectangular-frustum color filters 332. The period of this two-dimensional array may equal that of photodiode array 212A, such that each rectangular-frustum color filter 332 is aligned to a respective photodiode 212. Alternatively, the period of the two-dimensional array of rectangular-frustum color filters 332 may be less than pixel pitch 213. In embodiments, this period is pixel pitch 213 divided by a positive integer N, such that each photodiode 212 has a respective a N×N array of rectangular-frustum color filters 332 aligned thereto. Example values of N are N=2 and N=3.

When color-filter layer 230 includes a two-dimensional array of rectangular-frustum color filters 332, color-filter layer 230 functions as an anti-reflective coating at sufficiently large wavelengths, e.g., those exceeding two times the larger of widths 334 and 335. Similar to a moth-eye coating, an array of rectangular-frustum color filters 332 has effective refractive index $n_{eff}(z)$ that increases, without discontinuities for example, between the top surface of rectangular-frustum color filters 332 and top surface 229. Accordingly, at wavelengths larger than bottom-base width 234, color-filter layer 230 mimic graded-index layer with refractive index $n(z)=n_{eff}(z)$ that reduces reflectivity by removing discontinuities in refractive index.

In embodiments, rectangular-frustum color filter 332 may include a rectangular cuboid section 340 that has transverse dimensions equal to base widths 334X and 334Y in directions 298X and 298Y respectively. Rectangular cuboid section 340 has a height 343. In embodiments, height 343 is less than height 336. For example, height 343 is between 0.9 μm and 1.1 μm and height 336 is between 1.3 μm and 1.5 μm.

In embodiments, top-base width 235, FIG. 2, equals a smallest attainable feature size associated with a manufacturing process the produces color filters 232, such that one or more one or more color filters 232 is, to within fabrication limits, a rectangular pyramid. In embodiments, top-base widths 335X and 335Y may equal the aforementioned smallest attainable feature size, such that rectangular-frustum color filter 332 is a rectangular pyramid.

In embodiments, the three-dimensional shape of one or more color filters 232 is a cone frustum, where base widths 234 and 235 are diameters of the cone frustum's bottom and top bases, respectively. In embodiments, the specific shape of a color filter 232 may vary as a function of its position on the image sensor. For example, the shape of color filter 232 may be a function of the angle of a chief ray transmitted by an imaging lens of camera 190 and incident on the color filter.

In embodiments, in multiple cross-sectional planes parallel to x-z plane, the color filter 232(1) has a first surface profile that includes at least one period of one of a pulse-train surface profile, a square-waveform surface profile, a triangle-waveform surface profile, and a sawtooth-waveform surface profile. The least one period may be less than or equal to pixel pitch 213.

Figure 4:
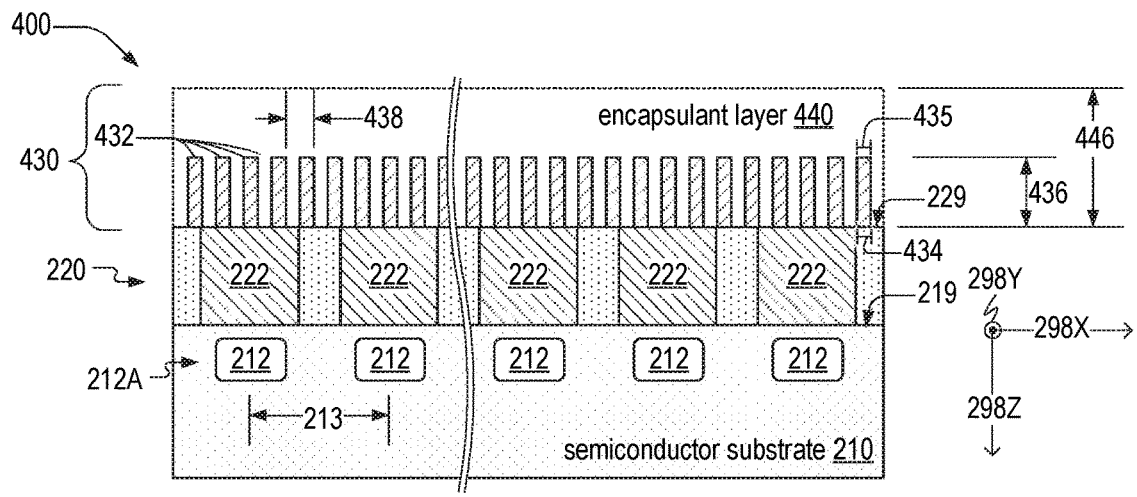
FIG. 4 is a cross-sectional schematic of a first polarization-sensitive image sensor, which is an embodiment of the image sensor of FIG. 1.

FIG. 4 is a cross-sectional schematic of a polarization-sensitive image sensor 400, which is an example of image sensor 100. Polarization-sensitive image sensor 400 is similar to image sensor 200 with color-filter layer 230 replaced by a polarization-sensitive color-filter layer 430, which is an example of color-filter layer 230. Polarization-sensitive color-filter layer 430 includes a plurality of rectangular elements 432 arranged such that, in multiple cross-sectional planes parallel to the x-z plane and intersecting waveguide cores 222, color-filter layer 430 has a pulse-train waveform surface profile or a square-wave surface profile. Each rectangular element 432 may be identical.

Each rectangular element 432 has a bottom-width 434, a top-width 435, and a height 436. When widths 434 and 435 are equal, each rectangular element 432 is a right rectangular prism. When widths 434 exceeds width 435, each rectangular element 432 is a trapezoidal prism that has antireflective properties similar to the aforementioned two-dimensional array of rectangular-frustum color filters 332.

Rectangular elements 432 may be periodically spaced in direction 298X by a spatial period 438, which may be less than pixel pitch 213. In embodiments, height 436 exceeds both width 434 and width 435.

In embodiments, each rectangular element 432 is an aluminum nanowire, wherein each of width 435 and height 436 are equal and between 110 nm and 130 nm, spatial period 438 is between 250 nm and 500 nm, and width 435 divided by spatial period 438 is between 0.4 and 0.6.

Layer 430 may include an encapsulating dielectric 440 that encapsulates rectangular element 432. Encapsulating dielectric 440 may be formed of silicon dioxide, and have a height 446 that exceeds width 435. For example, height 446 is between 180 nm and 220 nm. In such embodiments, layer 430 functions as a polarization-sensitive color filter, as described in Raj Shrestha, V. et al. Polarization-tuned Dynamic Color Filters Incorporating a Dielectric-loaded Aluminum Nanowire Array. *Sci. Rep.* 5, 12450; doi: 10.1038/srep12450 (2015).

Figure 5:
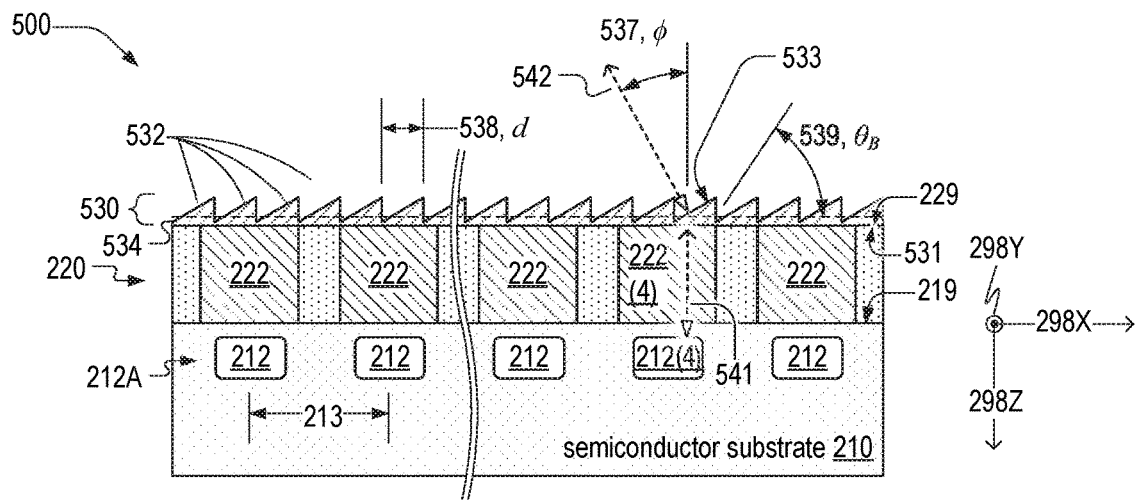
FIG. 5 is a cross-sectional schematic of a first field-angle-sensitive image sensor, which is an embodiment of the image sensor of FIG. 1.

FIG. 5 is a cross-sectional schematic of a field-angle-sensitive image sensor 500, which is an example of image sensor 100. Field-angle-sensitive image sensor 500 is similar to image sensor 200 with color-filter layer 230 replaced by a blazed-grating color-filter layer 530. Blazed-grating color-filter layer 530 is an example of color-filter layer 230. Blazed-grating color-filter layer 530 includes a plurality of triangular color filters 532 arranged such that, in multiple transverse planes intersecting waveguide cores 222, color-filter layer 530 has a sawtooth-waveform surface profile. Each triangular color filter 532 may be identical. Triangular filter 532 may have a flat-top surface parallel to top surface 229, such that its shape is trapezoidal in multiple transverse planes intersecting waveguide cores 222. Blazed-grating color-filter layer 530 may include a base layer 534 such that the transverse shape of triangular filter 532 is that of a rectangle adjoined to either a triangle or a base of a trapezoid. Base layer 534 and triangular color filter 532 may be monolithic.

Triangular color filters 532 may be periodically spaced in direction 298X by a spatial period 538 (also labelled d in FIG. 5), which may be less than or equal to pixel pitch 213. In embodiments, each triangular color filter 532 has a height that exceeds its width in direction 298X.

When triangular color filters 532 form a blazed-grating, color-filter layer 530 diffracts monochromatic light (free-space wavelength $\lambda_0$) normally-incident thereon into a single diffraction order that propagates at a diffraction angle 537 (also labeled φ in FIG. 5) with respect to the normal-incidence direction, direction 298Z. For example, monochromatic light ray 541 propagates from photodiode 212(4), through waveguide core 222(4), is normally incident on a bottom surface 531 of color filter layer 530, and exits color filter layer 530 at angle 537 as ray 542. Angle 537 is determined by spatial period d, blaze angle 539 (also labeled $\theta_B$ in FIG. 5) of color filters 532, and free-space wavelength $\lambda_0$. Color-filter layer 530 may include, over a single photodiode 212, a blazed transmission grating including a plurality of triangular color filters 532, that transmits a ray a center wavelength $\lambda_0$ at diffracted angle 537 determined by center wavelength $\lambda_0$, the grating's spatial period 538 ($d$), and the grating's blaze angle 539 ($B_B$). Respective propagation directions of rays 541 and 542 can be reversed such that, for light at free-space wavelength $\lambda_0$, photodiode 212(4) detects only light propagating at angle 537, and not at other angles.

In embodiments, the blazed transmission grating formed by triangular color filters 532 is designed to operate in the Littrow configuration, where blaze angle 539 equals diffraction angle 537, and ray 542 is exits (or enters) an angled surface 533 of color filter 532. In this configuration, blaze angle 539 ($\theta_B$) is determined by diffraction order m, free-space wavelength $\lambda_0$, and grating spatial 538 ($d$):

$$\sin\theta_B = \frac{m\lambda_0}{2d}.$$

In embodiments, the refractive indices of layer 530 ($n_{530}$ at $\lambda_0$) and waveguide core 222 ($n_{222}$ at $\lambda_0$) determine, according to Snell's Law and the aforementioned expression for $\theta_B$, a value of grating period d and blaze angle $\theta_B$ such that when ray 542 exits layer 530 at an incident angle $\theta_B$ (at the interface of surfaces 229 and 531 above waveguide 222(4), the resultant refracted ray (ray 541) propagates in direction 298Z to photodiode 212(4). Applying Snell's Law results in $\sin\theta_B = n_{222}/n_{530}$. Combining this result for the aforementioned expression for $\sin\theta_B$ based on the grating equation yields a relationship between refractive index values, free-space wavelength $\theta_0$, grating period d, and diffracted order m:

$$\frac{n_{222}}{n_{530}} = \frac{m\lambda_0}{2d}.$$

Figure 6:
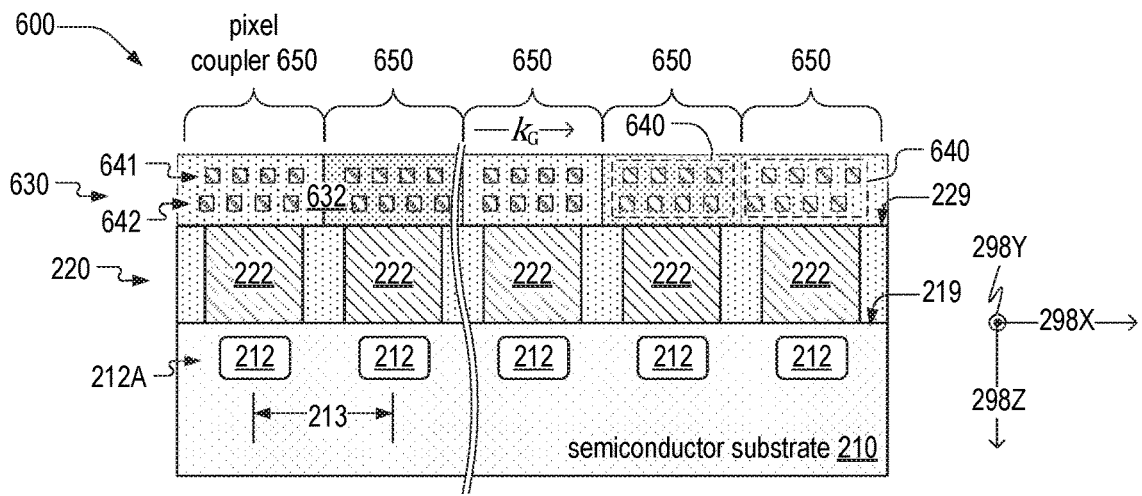
FIG. 6 is a cross-sectional schematic of a second field-angle-sensitive image sensor, which is an embodiment of the image sensor of FIG. 1.

FIG. 6 is a cross-sectional schematic of a field-angle-sensitive image sensor 600, which is an example of image sensor 100. Field-angle-sensitive image sensor 600 is similar to image sensor 200 with color-filter layer 230 replaced by a field-angle-sensitive color-filter layer 630, and includes a plurality of pixel couplers 650, each of which are examples of pixel couplers 250. Field-angle-sensitive color-filter layer 630 is an example of color-filter layer 230.

Field-angle-sensitive color-filter layer 630 includes an encapsulating layer 632 that surrounds and supports a plurality of stacked-diffraction-grating pairs 640 each aligned to a respective photodiode 212. In embodiments, encapsulating layer 632 is a color-filter array with stacked-diffraction-grating pairs 640 embedded therein, such that a region of encapsulating layer 632 of a first pixel coupler 650 has a transmission spectrum differing from a transmission spectrum of encapsulating layer 632 of at least one pixel coupler 650 adjacent thereto. Encapsulating layer 632 is, for example, a color-filter array associated with either an additive color space or subtractive color space, as described above regarding color-filter layer 230.

Each stacked-diffraction-grating pair 640 includes a primary grating 641 and an analyzer grating 642 between primary grating 641 and top surface 229. Gratings 641 and 642 are parallel to top surface 229. For example, each of their respective grating vectors are parallel (or anti-parallel) in a plane parallel to top surface 229. In FIG. 6, the grating vectors of gratings 641 and 642 as being parallel to direction 298X, as denoted by vector $\vec{k}_G$. In embodiments, gratings 641 and 642 may be oriented such that their respective grating vectors are parallel to direction 298Y.

Gratings 641 and 642 are longitudinally separated in direction 298Z by a half-integer multiple of a Talbot length $z_T$ determined by the period a of primary grating 641 (in the direction of grating vector $k_G$) and wavelength $\lambda$ of illumination incident thereon: $z_T = \lambda/(1-\sqrt{1-\lambda^2/\alpha^2})$. For each stacked-diffraction-grating pair 640 to produce a requisite Talbot effect required to enable angle sensitivity of pixel coupler 650, period $\alpha$ is less than one-fifth of the width of photodiode 212 in direction 298X. In each pixel coupler 650, analyzer grating 642 is laterally offset from primary grating 641 in direction 298X. The magnitude of this offset determines the angular sensitivity of pixel coupler 650, e.g., its generated photocurrent as a function of incident illumination angle. In embodiments, gratings 641 and 642 are formed of a metal, and encapsulating layer 632 is a dielectric that includes a pigment and/or a dye.

Figure 7:
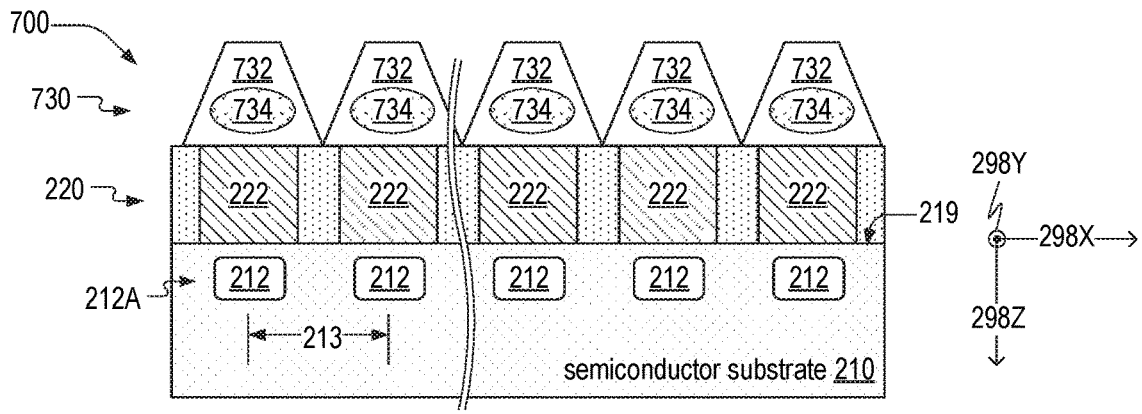
FIG. 7 is a cross-sectional schematic of a chirality-sensitive image sensor, which is an embodiment of the image sensor of FIG. 1.

FIG. 7 is a cross-sectional schematic of a chirality-sensitive image sensor 700, which is an example of image sensor 100. Chirality-sensitive image sensor 700 is similar to image sensor 200 with color-filter layer 230 replaced by a chirality-sensitive color-filter layer 730, which is an example of color-filter layer 230. Chirality-sensitive color-filter layer 730 includes a plurality of color filters 732, each of which is similar to a color filter 232 with a plurality of chiral elements 734 embedded therein. Each chiral element 734 exhibits optical activity at visible and/or near-IR wavelengths such that its transmission depends on the handedness (left, right) of the circular polarization component of light incident thereon. Chiral elements 734 may be part of a chiral metamaterial. In embodiments, each color filter 732 has a rectangular transverse cross-section and has a width equal to pixel pitch 213 such that chirality-sensitive color-filter layer 730 has planar top surface.

Figure 8:
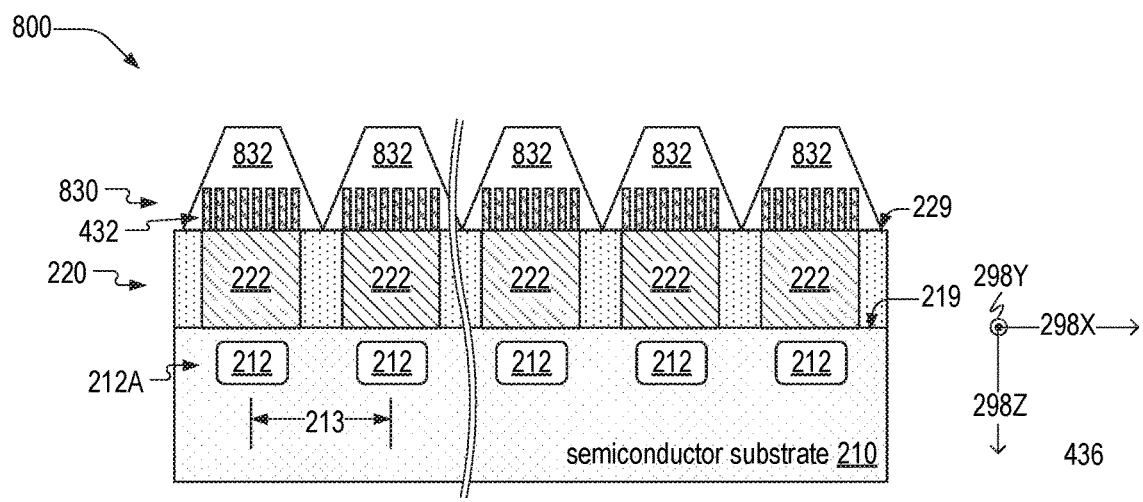
FIG. 8 is a cross-sectional schematic of a second polarization-sensitive image sensor, which is an embodiment of the image sensor of FIG. 1.

FIG. 8 is a cross-sectional schematic of a polarization-sensitive image sensor 800, which is an example of image sensor 100. Polarization-sensitive image sensor 800 is similar to image sensor 200 with color-filter layer 230 replaced by a polarization-sensitive color-filter layer 830, which is an example of color-filter layer 230. Polarization-sensitive color-filter layer 830 includes a plurality of color filters 832, each of which is similar to a color filter 232 with a plurality of rectangular elements 432 embedded therein. Rectangular elements 432 were introduced herein as part of polarization-sensitive image sensor 400, FIG. 4. Accordingly, polarization-sensitive image sensor 800 combines the light-capturing features of image sensor 200 with polarization sensitive features similar to that of polarization-sensitive image sensor 400.

Figure 9:
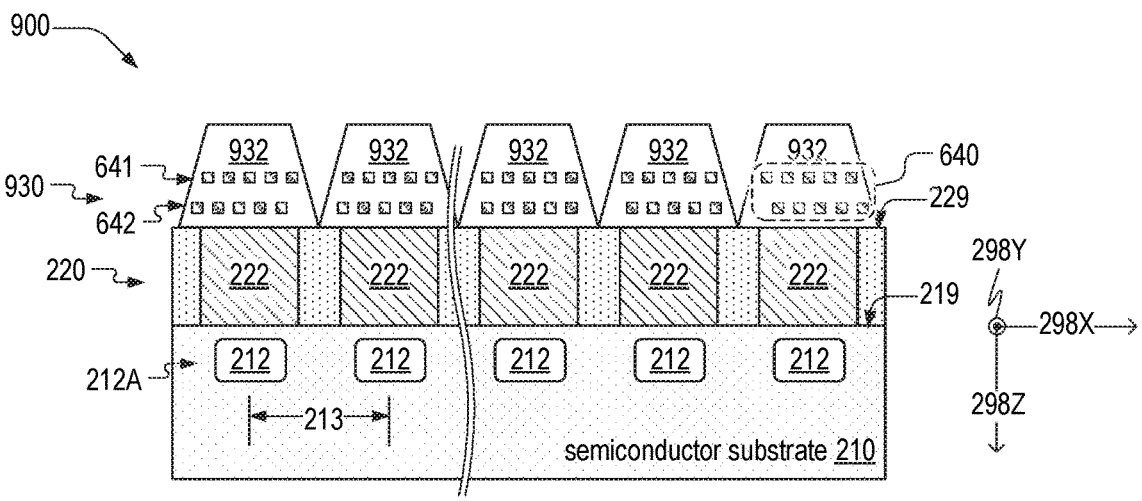
FIG. 9 is a cross-sectional schematic of a third field-angle-sensitive image sensor, which is an embodiment of the image sensor of FIG. 1.

FIG. 9 is a cross-sectional schematic of a field-angle-sensitive image sensor 900, which is an example of image sensor 100. Field-angle-sensitive image sensor 900 is similar to image sensor 200 with color-filter layer 230 replaced by field-angle-sensitive color-filter layer 930, which is an example of color-filter layer 230. Field-angle-sensitive color-filter layer 930 includes a plurality of color filters 932, each of which is similar to a color filter 232 with a stacked-diffraction-grating pair 640 embedded therein. Stacked-diffraction-grating pair 640 was introduced herein as part of field-angle-sensitive image sensor 600, FIG. 6. Accordingly, field-angle-sensitive image sensor 900 combines the light-capturing features of image sensor 200 with field-angle sensitive features similar to that of field-angle-sensitive image sensor 600.

Figure 10:
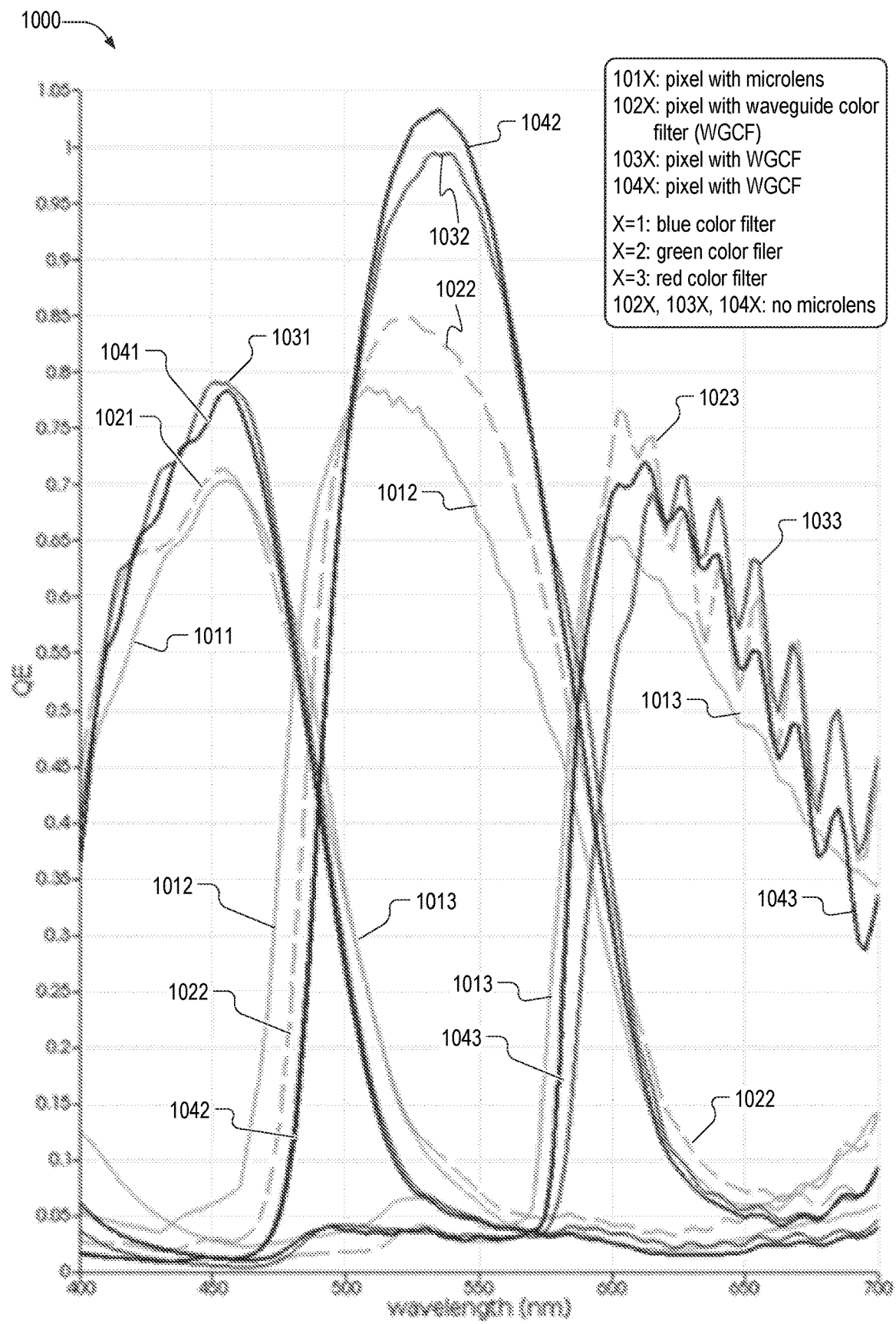
FIG. 10 shows simulated spectral-responses of embodiments of the image sensor of FIG. 1.

FIG. 10 is a spectral response plot 1000 generated by full-wave electromagnetic simulations of a two-by-two pixel array. The pitch of the two-by-two pixel array is 0.9 µm. Spectral response plot 1000 includes spectral responses 101X, 102X, 103X, and 104X, where X equals either 1, 2, or 3, which denote, respectively, a blue color filter, a green color filter, and a red color filter, on a respective pixel of the two-by-two pixel array. The color filters are arranged as a Bayer cell on the two-by-two pixel array: two corner-adjacent green filters, a red filter, and a blue filter corner-adjacent to the red filter.

Simulations that produced spectral responses 1011, 1012, and 1013 include a microlens on each pixel of the two-by-two pixel array, while lacking waveguides 224 and color filters 232. The microlens was absent in simulations that produced spectral responses 102X, 103X, and 104X. In the simulation, the incident light was linearly polarized, propagated at normal incidence with respect to a plane of the two-by-two pixel array, and ranged from 0.4 µm to 0.7 µm.

Simulations that produced spectral responses 1021, 1022, and 1023 include a one-micron thick waveguide on each pixel, the waveguide being an example of waveguide 224. Peak magnitudes of spectral responses 1021, 1022, and 1023 indicates improved quantum efficiency compared to respective spectral responses 1011, 1012, and 1013 resulting from replacing the microlens with the waveguide.

Simulations that produced spectral responses 1031, 1032, and 1033 include the waveguide and a square-pyramid color filter on each pixel. Simulations that produced spectral responses 1041, 1042, and 1043 include the waveguide and a square-pyramid color filter on three of the four pixels of the two-by-two pixel array: two green color filters (diagonally adjacent) and one blue color filter. The remaining pixel has a waveguide with a core formed of a red color-filter material. A technical benefit of this remaining pixel lacking a square-pyramid there is reduced cross-talk without significant decrease in spectral response. The square-pyramid color filter is an example of rectangular-frustum color filter 332 with height of 1.4 μm. Peak magnitudes of spectral responses 1031, 1032, and 1033 indicate improved quantum efficiency compared to respective spectral responses 1011/1021, 1012/1022, and 1013/1023 resulting from adding the square-pyramid color filter on the waveguide.

Features described above as well as those claimed below may be combined in various ways without departing from the scope hereof. The following enumerated examples illustrate some possible, non-limiting combinations:

(A1) An image sensor includes a two-dimensional photodiode-array formed in a semiconductor substrate, a first waveguide, and a first color filter. The first waveguide is aligned to a first photodiode of the photodiode-array, located above a top substrate surface of the semiconductor substrate. A first core of the first waveguide has a first core width that is less than a pitch of the photodiode-array in a first direction and a second direction corresponding to respective orthogonal dimensions of the photodiode-array. The first color filter is on a top waveguide surface of the first waveguide and has a first non-uniform thickness above the first core. The first waveguide is between the top substrate surface and the first color filter.

(A2) In any image sensor (A1), the pitch may be less than or equal to 1.0 micrometers.

(A3) In any image sensor (A1)-(A2) a shape of the first color filter may be a trapezoidal prism having a trapezoidal shape in a cross-sectional plane perpendicular to and intersecting the top waveguide surface.

(A4) In any image sensor (A3), the trapezoidal shape may be one of an acute trapezoid and a right trapezoid.

(A5) In any image sensor (A3), the trapezoidal shape may be a rectangle.

(A6) In any image sensor (A1)-(A2), a shape of the first color filter may be one of a rectangular pyramid and a rectangular frustum.

(A7) In any image sensor (A1)-(A2), a shape of the first color filter may be one of a rectangular pyramid and a rectangular frustum.

(A8) In any image sensor (A7), in each of the first and second directions, the rectangular cuboid may have a width less than or equal to the pitch.

(A9) In any image sensor (A1)-(A8), the first color filter may have a filter spectral passband that is narrower than a spectral passband of a cladding of the first waveguide.

(A10) In any image sensor (A9), the first color filter may be formed of a dielectric material and including one of a dye and pigment that absorbs electromagnetic radiation outside of the filter spectral passband.

(A11) In any image sensor (A9)-(A10), the first color filter and a core of the first waveguide being formed of a same material.

(A12) In any image sensor (A11), the first color filter and a core of the first waveguide may be monolithic.

(A13) Any image sensor (A1)-(A12) may further include a second waveguide and a second color filter. The second waveguide is aligned to a second photodiode of the photodiode-array side-adjacent to the first photodiode, located above the top substrate surface. A second core of the second waveguide has a second core width less than the pitch in the first and second directions. The second color filter is on a top waveguide surface of the second waveguide and has a second non-uniform thickness above the second core. The second waveguide may be between the top substrate surface and the second color filter.

(A14) In any image sensor (A13), the first color filter and a core of the first waveguide may be formed of a same first material, and the second color filter and a core of the second waveguide may be formed of a second material that differs from the first material.

(A15) Any image sensor (A1)-(A14) in multiple cross-sectional planes parallel to the first direction and perpendicular to the top substrate surface, the first color filter may have a first surface profile that includes at least one period of one of a pulse-train surface profile, a square-waveform surface profile, a triangle-waveform surface profile, and a sawtooth-waveform surface profile.

(A16) In any image sensor (A15), the at least one period may be less than or equal to the pitch.

(A17) Any image sensor (A15)-(A16) may further include (a) a plurality of waveguides including the first waveguide and two additional waveguides and (b) a color-filter layer on the top waveguide surface and directly above the plurality of waveguides. Each of the plurality of waveguides is (i) aligned to a respective photodiode of a plurality of collinear photodiodes of the two-dimensional photodiode-array, (ii) located above the top substrate surface, (iii) has a respective core width less than the pitch in the first and the second direction, and (iv) part of the top waveguide surface. The color filter includes the first color filter and has a multi-pixel surface profile that includes at least one period of one of the pulse-train surface profile, the square-waveform surface profile, the triangle-waveform surface profile, and the sawtooth-waveform surface profile.

(A18) In any image sensor (A17), the multi-pixel surface profile may include multiple periods of the first surface profile.

(A19) Any image sensor (A1)-(A18) may further include a plurality of aluminum nanowires embedded in the first color filter and arranged in a one-dimensional array parallel to the top waveguide surface. Each of the plurality of aluminum nanowires has a cross-sectional width and a cross-sectional height each not exceeding 130 nanometers.

(A20) Any image sensor (A1)-(A19) may further include a first diffraction grating and a second diffraction grating. The first diffraction grating is embedded in the first color filter and has a first grating vector parallel to the top substrate surface. The second diffraction grating is embedded in the first color filter, between the first diffraction grating and the top substrate surface, and has a second grating vector parallel to the first grating vector.

Changes may be made in the above methods and systems without departing from the scope of the present embodiments. It should thus be noted that the matter contained in the above description or shown in the accompanying drawings should be interpreted as illustrative and not in a limiting sense. Herein, and unless otherwise indicated the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:

1. An image sensor with micro-structured color filter comprising:
    a two-dimensional photodiode-array formed in a semiconductor substrate;
    a first waveguide aligned to a first photodiode of the photodiode-array and located above a top substrate surface of the semiconductor substrate, a first core of the first waveguide being formed of a first material and having a first core width less than a pitch of the photodiode-array in a first direction and a second direction corresponding to respective orthogonal dimensions of the photodiode-array;
    a first color filter on a top waveguide surface of the first waveguide, being formed of the first material, and having a first non-uniform thickness above the first core, the first waveguide being between the top substrate surface and the first color filter;
    a second waveguide aligned to a second photodiode of the photodiode-array side-adjacent to the first photodiode and located above the top substrate surface, a second core of the second waveguide being formed of a second material that differs from the first material and having a second core width less than the pitch in the first and second directions; and
    a second color filter on a top waveguide surface of the second waveguide, being formed of the second material, and having a second non-uniform thickness above the second core, the second waveguide being between the top substrate surface and the second color filter,
    the first color filter having a first spectral passband differing from a second spectral passband of the second color filter.

2. The image sensor of claim 1, the pitch not exceeding 1.0 micrometers.

3. The image sensor of claim 1, a shape of the first color filter being a trapezoidal prism having a trapezoidal shape in a cross-sectional plane perpendicular to and intersecting the top waveguide surface.

4. The image sensor of claim 3, the trapezoidal shape being one of an acute trapezoid and a right trapezoid.

5. The image sensor of claim 3, the trapezoidal shape being a rectangle.

6. The image sensor of claim 1, a shape of the first color filter being one of a rectangular pyramid and a rectangular frustum.

7. The image sensor of claim 1, a shape of the first color filter being a rectangular cuboid adjoined to a base of one of a rectangular pyramid and a rectangular frustum.

8. The image sensor of claim 7, in each of the first and second directions, the rectangular cuboid having a width not exceeding the pitch.

9. The image sensor of claim 1, the first color filter having a filter spectral passband that is narrower than a spectral passband of a cladding of the first waveguide.

10. The image sensor of claim 9, the first color filter being formed of a dielectric material and including one of a dye and pigment that absorbs electromagnetic radiation outside of the filter spectral passband.

11. The image sensor of claim 1, the first color filter and a core of the first waveguide being monolithic.

12. The image sensor of claim 1, in multiple cross-sectional planes parallel to the first direction and perpendicular to the top substrate surface, the first color filter having a first surface profile that includes at least one period of one of a pulse-train surface profile, a square-waveform surface profile, a triangle-waveform surface profile, and a sawtooth-waveform surface profile.

13. The image sensor of claim 12, the at least one period not exceeding the pitch.

14. The image sensor of claim 12, further comprising:
    a plurality of waveguides including the first waveguide and two additional waveguides, each of the plurality of waveguides being (i) aligned to a respective photodiode of a plurality of collinear photodiodes of the two-dimensional photodiode-array, (ii) located above the top substrate surface, (iii) having a respective core width less than the pitch in the first and the second direction, and (iv) part of the top waveguide surface; and
    a color-filter layer on the top waveguide surface and directly above the plurality of waveguides, including the first color filter, and having a multi-pixel surface profile that includes at least one period of one of the pulse-train surface profile, the square-waveform surface profile, the triangle-waveform surface profile, and the sawtooth-waveform surface profile.

15. The image sensor of claim 12, the multi-pixel surface profile including multiple periods of the first surface profile.

16. The image sensor of claim 1, further comprising a plurality of aluminum nanowires embedded in the first color filter, arranged in a one-dimensional array parallel to the top waveguide surface, each of the plurality of aluminum nanowires having a cross-sectional width and a cross-sectional height each not exceeding 130 nanometers.

17. The image sensor of claim 1, further comprising:
    a first diffraction grating embedded in the first color filter and having a first grating vector parallel to the top substrate surface; and
    a second diffraction grating embedded in the first color filter, between the first diffraction grating and the top substrate surface, and having a second grating vector parallel to the first grating vector.

* * * * *